United States Patent [19]
Davis

[11] Patent Number: 5,980,299
[45] Date of Patent: Nov. 9, 1999

[54] BOARD-MOUNTABLE MODULE GUIDE

[75] Inventor: Wayne Samuel Davis, Harrisburg, Pa.

[73] Assignee: The Whitaker Corporation, Wilmington, Del.

[21] Appl. No.: 09/062,535

[22] Filed: Apr. 17, 1998

[51] Int. Cl.[6] .................................................. H01R 13/64
[52] U.S. Cl. .......................................... 439/377; 361/802
[58] Field of Search ........................... 439/377, 64, 157; 361/802

[56] References Cited

U.S. PATENT DOCUMENTS

| | | | |
|---|---|---|---|
| 4,070,081 | 1/1978 | Takahashi | 339/91 |
| 4,178,051 | 12/1979 | Kocher et al. | 339/45 |
| 4,241,966 | 12/1980 | Gomez | 339/45 |
| 4,349,237 | 9/1982 | Cobaugh et al. | 339/65 |
| 4,648,009 | 3/1987 | Beun et al. | 361/399 |
| 4,712,848 | 12/1987 | Edgley | 439/327 |
| 4,761,141 | 8/1988 | Hawk et al. | 439/153 |
| 4,872,853 | 10/1989 | Webster | 439/327 |
| 5,030,108 | 7/1991 | Babow et al. | 439/64 |
| 5,162,979 | 11/1992 | Anzelone et al. | 361/415 |
| 5,267,872 | 12/1993 | Gou et al. | 439/326 |
| 5,417,580 | 5/1995 | Tsai | 439/328 |
| 5,542,854 | 8/1996 | Bowen | 439/377 |
| 5,573,408 | 11/1996 | Laub et al. | 439/62 |
| 5,649,831 | 7/1997 | Townsend | 439/157 |
| 5,726,865 | 3/1998 | Webb et al. | 361/801 |
| 5,730,611 | 3/1998 | Cheng et al. | 439/160 |
| 5,762,513 | 6/1998 | Stine | 439/358 |

OTHER PUBLICATIONS

U.S. Serial No. 09/063,127 filed Apr. 20, 1998 (Abstract and Drawings only).

*Primary Examiner*—Neil Abrams
*Assistant Examiner*—J. F. Duverne
*Attorney, Agent, or Firm*—Anton P. Ness

[57] ABSTRACT

A module guide assembly (10) having end blocks (30) surrounding a receptacle connector (14) on a circuit board (12), and further having guide members (60) to facilitate mating of a circuit card (104) of a card-containing module (100) with the connector. The guide members (60,62) are pivotably mounted to the end blocks (30) to be rotated between an upright orientation for module receipt, and a recumbent orientation parallel to the board when the module (100) is not mated to the connector. Pivot embossments (44) are seated in apertures (72) to permit pivoting, and slots (78) extend from apertures (72) to an edge of a tab section (74) to receive embossments (44) thereinto during assembly.

16 Claims, 5 Drawing Sheets

¹

BOARD-MOUNTABLE MODULE GUIDE

FIELD OF THE INVENTION

The present invention relates to the field of electrical connections and more particularly to components mountable to a circuit board.

BACKGROUND OF THE INVENTION

In computers and other electronic equipment, circuit boards are utilized to which are mounted numerous electrical and electronic components. Smaller circuit cards are utilized to establish electrical connections to a larger circuit board in a manner that permits removal and disconnection, by inserting an edge of the card into a receptacle connector mounted on the board and containing an array of contacts connected to circuits of the board; contact sections of the contacts are exposed within a card-receiving cavity of the connector that engage circuit pads on the card surfaces upon card insertion. It has become useful to secure certain cards within larger modules so that components mounted on the card are protected by the module covers during handling. Such modules need to be accurately guided during mating with the receptacle connector so that the leading end of the enclosed card is accurately received into the card-receiving cavity of the connector, since the module covers inhibit accurate visual alignment of the card with the cavity. It is known to provide elongate guide members projecting from the board from ends of receptacle connectors to facilitate mating in similar situations. Such elongate guide members may be mounted on the circuit board substantially prior to their actual use during module mating.

It is desired to provide a system for guiding the module during mating with the receptacle connector. It is also desired to provide module guides that maintain a low profile prior to module mating.

In U.S. patent application Ser. No. 09/063,127 (Whitaker Case No. 16929) filed Apr. 20, 1998 and assigned to the assignee hereof, is disclosed an assembly that includes a frame mountable on the circuit board surrounding the receptacle connector or optionally as an integral portion of the connector housing. At opposed ends of the frame are mounted respective guide members containing inwardly facing channels precisely aligned with the card-receiving cavity of the connector. The guide members are pivotably secured to the frame, so that the members may be pivoted to a recumbent orientation parallel to the circuit board when a module is not mated to the connector, and be pivoted to an erect position for use.

It is desired to provide pivotable guide members that are easily assembled to the frame.

SUMMARY OF THE INVENTION

Guide or retention members of the assembly are pivotably mountable to respective end blocks at ends of a receptacle connector. Mounting ends of the guide members include first cooperating pivot sections, while upstanding flanges of the end blocks include second cooperating pivot sections. One of the pivot sections is a cylindrical embossment, and the other is a pin-receiving aperture having a slot extending to an edge or end face of either the mounting end or the flange, with the slots preferably being orthogonal to the direction of insertion of the module along the guide channels. Each guide member is positioned parallel to the connector with the guide channel facing the connector and the slots aligned with the pivot pins, whereafter the guide member is pressed toward the end block such that the pivot pins are received into and along the slots until seated in the pin-receiving hole. Thereafter the guide members may be rotated to an upright position for receipt of a processor module therebetween.

In a first embodiment the pivot pins are defined on the end block flanges while the apertures and slots are defined on the guide member mounting section. In a second embodiment the pivot pins are defined on the guide member mounting sections while the apertures and slots are defined on the end block flanges.

Embodiments of the present invention will now be described by way of example with reference to the accompanying drawings.

BRIEF DESCRIPTION OF THE DRAWINGS

FIG. 3 is an isometric view of the assembly with the guide members in a retracted position;

DETAILED DESCRIPTION

Figure 1:
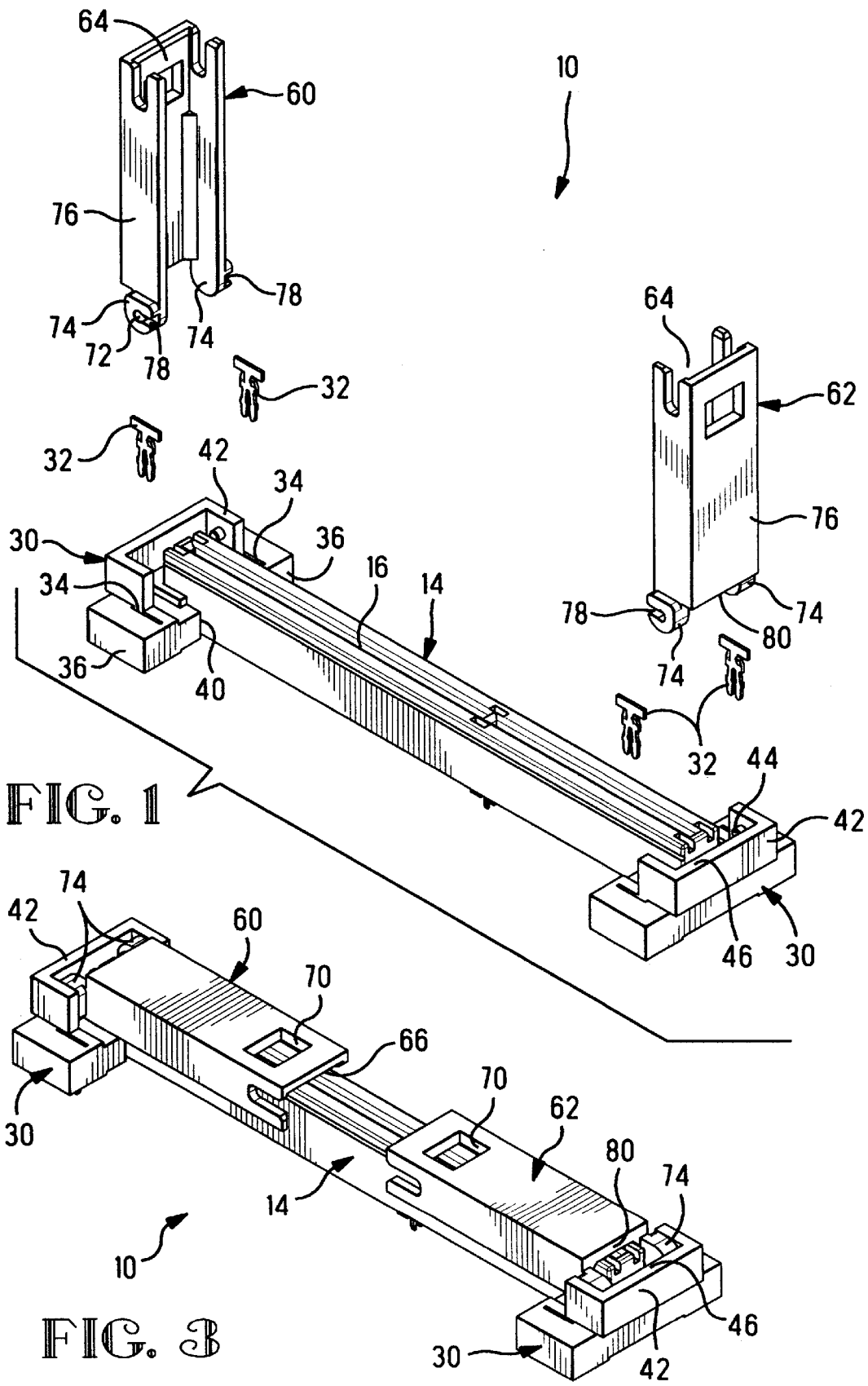
FIG. 1 is an isometric view of the present invention with the guide members and board locks exploded from respective end blocks.
Figure 2:
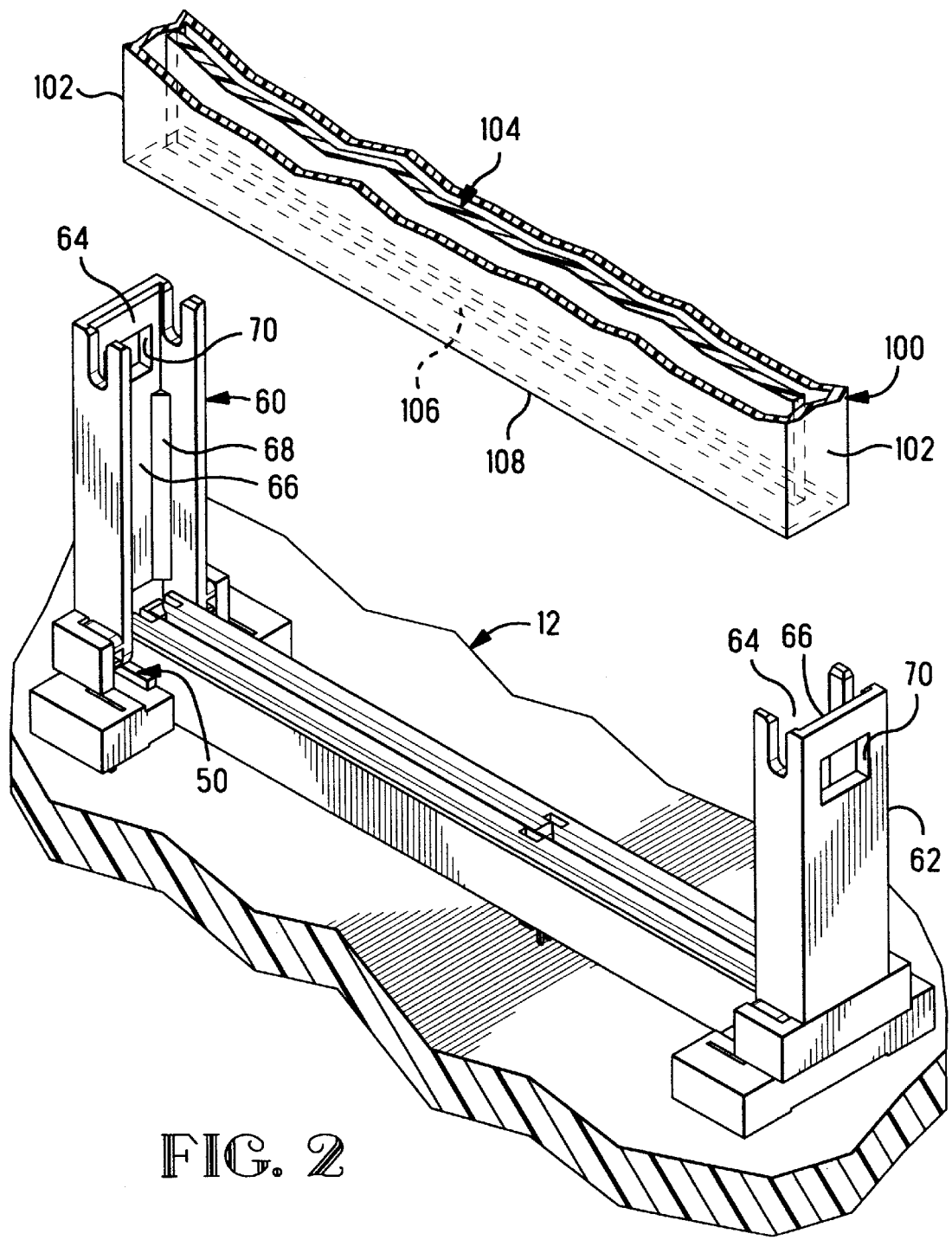
FIG. 2 is an isometric view of the frame with the guide members assembled thereto and positioned about a connector for module mating therewith.

Guide assembly 10 of a first embodiment in FIGS. 1 to 7 includes end blocks 30 and guide members 60,62 securable thereto, with the end blocks mountable to a circuit board 12 around a receptacle connector 14 as shown in FIGS. 1 to 3. Preferably, end blocks 30 and guide members 60,62 are molded of plastic material such as polycarbonate resin. Board locks 32 are shown to be utilized to secure the guide assembly to the circuit board upon insertion into respective slots 34 of mounting flanges 36 of the end blocks 30. Optionally, end blocks 30 may be integral portions of a frame that surrounds the sides of connector 14.

End blocks 30 each include a recess 40 within which is seated an end of a connector 14 disposed between guide members 60,62. Connector 14 may be, for example, a Slot 1 Connector sold by AMP Incorporated, Harrisburg, Pa. under Part Nos. 145251-1 and -2. Optionally, the connector housing may be formed to include the end blocks as integral portions thereof.

Guide channels 64 are defined along inner surfaces of guide members 60,62 and are precisely aligned with card-receiving cavity 16 of connector 14 when the guide members are affixed to end blocks 30. The guide channels are dimensioned to receive therein side portions 102 of module 100 (FIG. 2) having a card 104 contained therein, so that leading end 106 of card 104 exposed along leading module end 108 becomes aligned for receipt into card-receiving cavity 16 of connector 14 as side portions 102 move along the guide channels toward the connector during mating.

Figure 4:
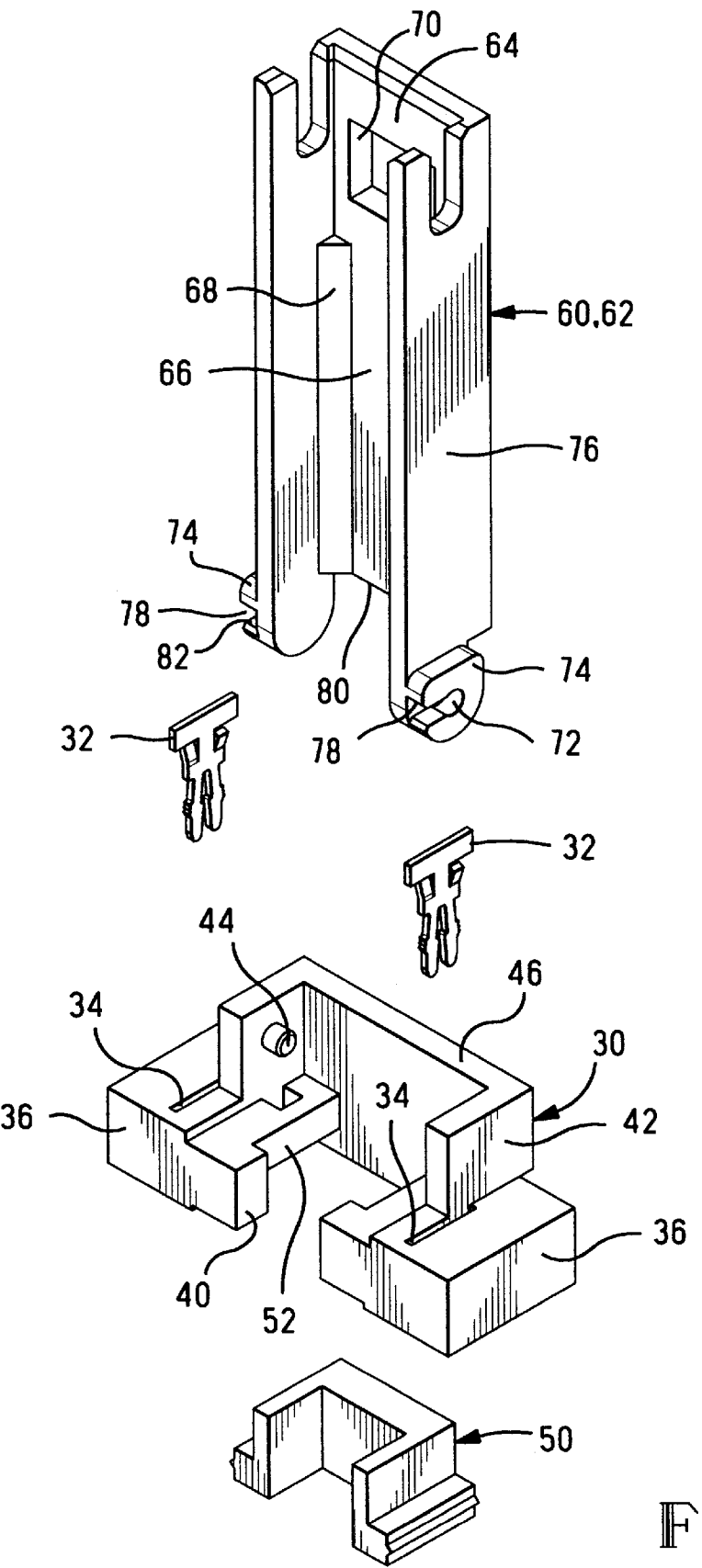
FIG. 4 illustrates a guide member exploded from an end block, with board locks and an vibration suppressor exploded from end block.

Entrances to the guide channels may be chamfered to facilitate insertion of the module side portions thereinto. Guide members 60,62 are positioned spaced apart so that the channel bottom surfaces 66 oppose each other the width of the module when in their upright orientation, so that the module is positioned accurately transversely for the card leading end to enter the card-receiving cavity. The guide channels may include chamfered inside corners 68 as shown serving to polarize the module and to assist in centering the module in the channels. The guide members may also include latch apertures 70 as shown within which corresponding latch projections (not shown) on side surfaces of the modules may latch for retention in the mated condition. Sufficient clearance around the connector is provided by guide assembly 10 for leading ends of the module covers therearound upon mating, when the card leading end is received within the card-receiving cavity. The assembly preferably includes vibration suppressors 50, as seen in FIG. 4. Each suppressor may be of elastomeric material and seated in a pocket 52 of a respective end block 30 adjacent the recess 40 and fitted around a connector end to become abutted by leading end 108 of processor module 100 upon insertion between guide members 60,62 and mated with connector 14.

Guide members 60,62 are affixable to upstanding flanges 42 of end blocks 30 in a manner that permits pivoting of the guide members between an upright orientation (FIG. 2) and a recumbent or horizontal orientation (FIG. 3). Upstanding flanges 42 include pivot sections shown to be cylindrical embossments 44, while the cooperating pivot sections of the guide members are apertures 72 complementary to the embossments defined on tab sections 74 depending from body sections 76 of the guide members. Slots 78 extend from apertures 72 to edges of tab sections 74 in a direction orthogonal to guide channels 64 and inwardly toward the receptacle connector 14 and the opposed guide member. While embossments 44 are shown herein to be integrally molded to the end block, separate metal pins could be similarly utilized secured in corresponding holes into the frame member for strength and durability.

Preferably, upstanding flanges 42 also include stop surfaces such as top edges 46 that become abutted by cooperating stop surfaces on frame-proximate ends of the guide members such as bottom edges 80 of body sections 76, so that pivoting of the guide members is stopped in the full upright orientation and the guide members are prepared to receive the module side portions therebetween. As shown, channel bottoms 66 abut the top of connector 14 to stop pivoting in the recumbent orientation in FIG. 3. Guide members 60,62 may be polarized to allow module insertion only when the module is in a single correct orientation.

Advantageously, a detent or latch could be provided that cooperates with the upright flanges to lock the guide members in the fully erect orientation, to facilitate module insertion.

Figure 5:
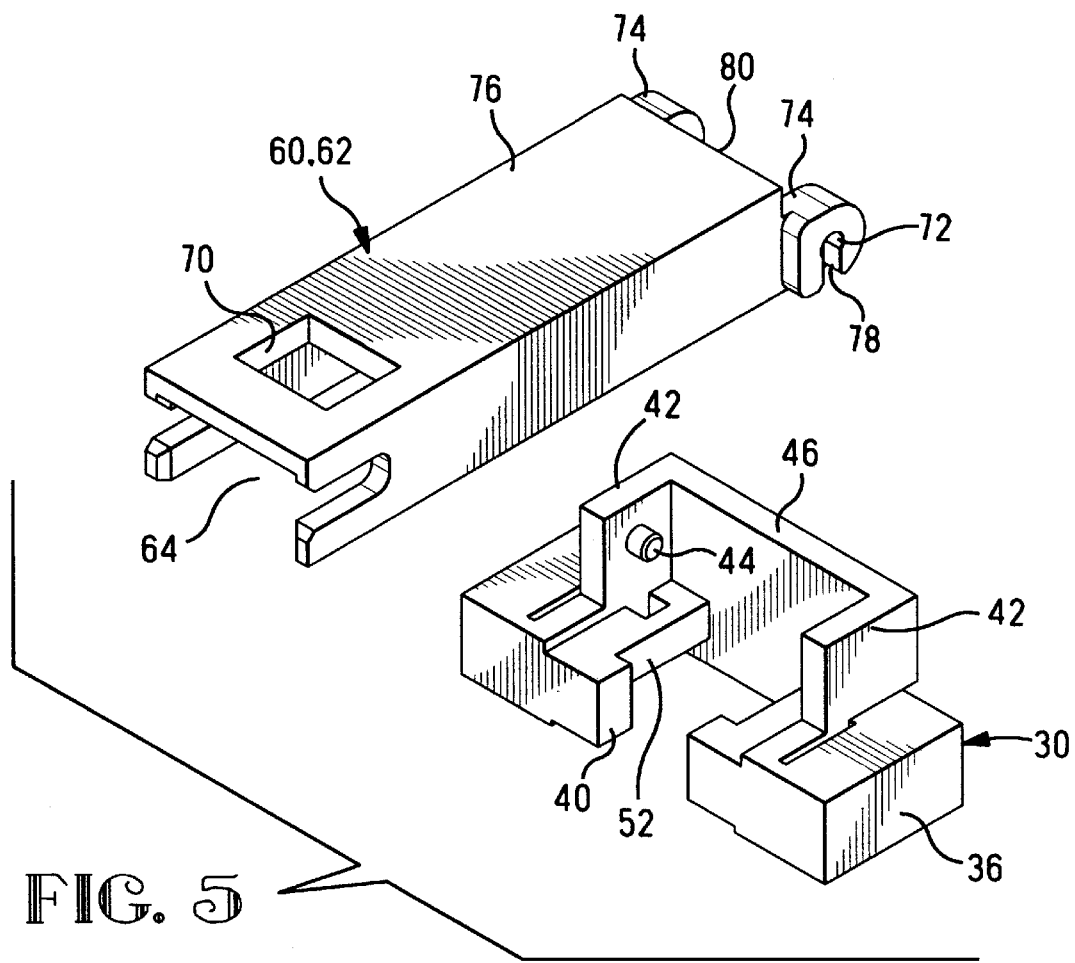
FIG. 5 is an isometric view of a guide member positioned for assembly to an end block.
Figure 6:
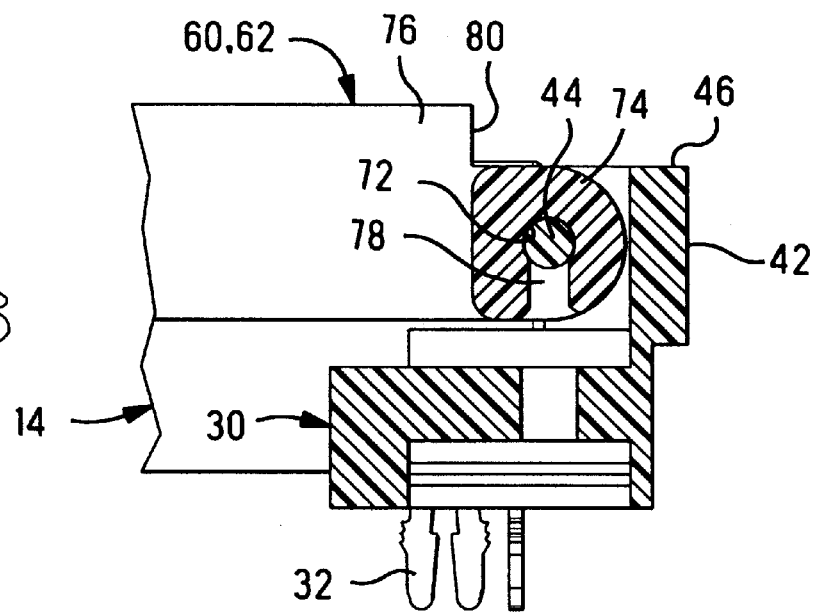
FIGS. 6 and 7 are section views of a guide member mounted to the end section showing the pivot sections thereof, with the guide member lowered and erect, respectively.
Figure 7:
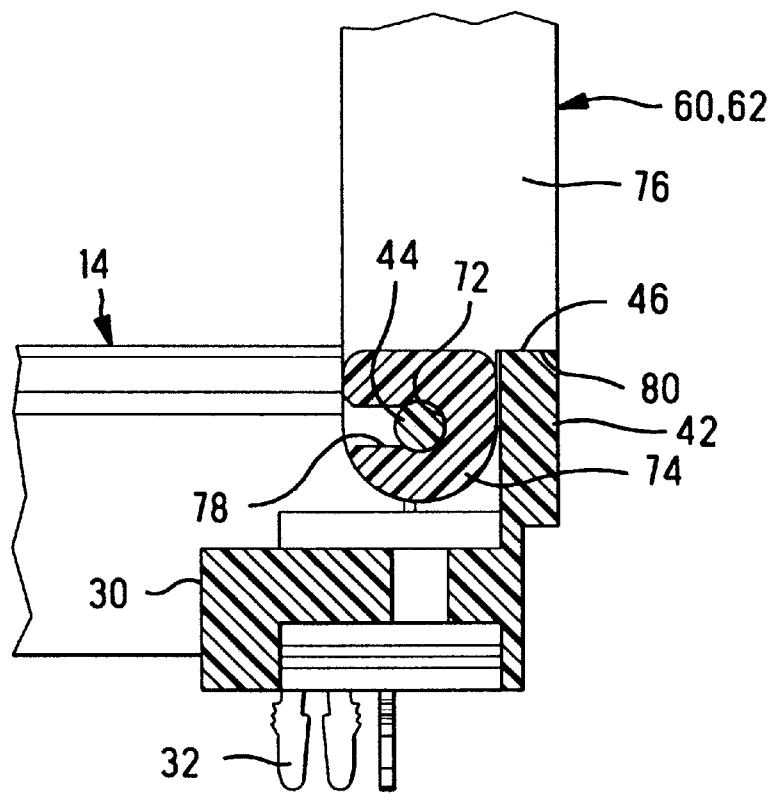

Referring now to FIGS. 4 to 7, Each guide member 60,62 is mountable to an end block 30 by being positioned with guide channel 64 facing downwardly toward the end block and extending toward the opposed end block, with tab sections 74 above the embossments 44 such that slots 78 are aligned therewith (FIG. 5). Thereafter, the guide member is urged toward the end block, the embossments are received into slots 78 in a compression fit and are moved therealong to become seated in apertures 72 (FIGS. 6 and 7). Aperture 72 permits pivoting movement in cooperation with cylindrical embossments 44 so that the guide member is pivotable between a recumbent position (FIG. 6) and an upright position (FIG. 7).

Tab sections 74 are thickened to assure ruggedness, and slots 78 are defined in only half the thickness of the tab section. Slots 78 are slightly smaller than the diameter of embossments 44 such that the embossments will remain in apertures 72 after assembly. Preferably, entrances 82 of slots 78 are widened such as by being chamfered or rounded to facilitate receipt thereinto of a respective embossment 44. When guide members 60,62 are in their recumbent positions, no upward force tends to lift the guide members from the end blocks and disengage the pivot system. When the guide members are upright, the guide members will not become disengaged from the end blocks since the upward forces are orthogonal to slots 78.

When guide members 60,62 are pivoted to their recumbent or horizontal position as shown in FIG. 3, the resulting low profile of the guide assembly 10 is advantageous during various handling and shipping procedures of the circuit board prior to its installation within electronic apparatus such as a computer. The guide members interfere less with assembly of various other components to the circuit board and are much less vulnerable to damage or destruction by inadvertently being struck by other objects, and also the circuit board is more easily handled and shipped in relatively compact containers.

Figure 8:
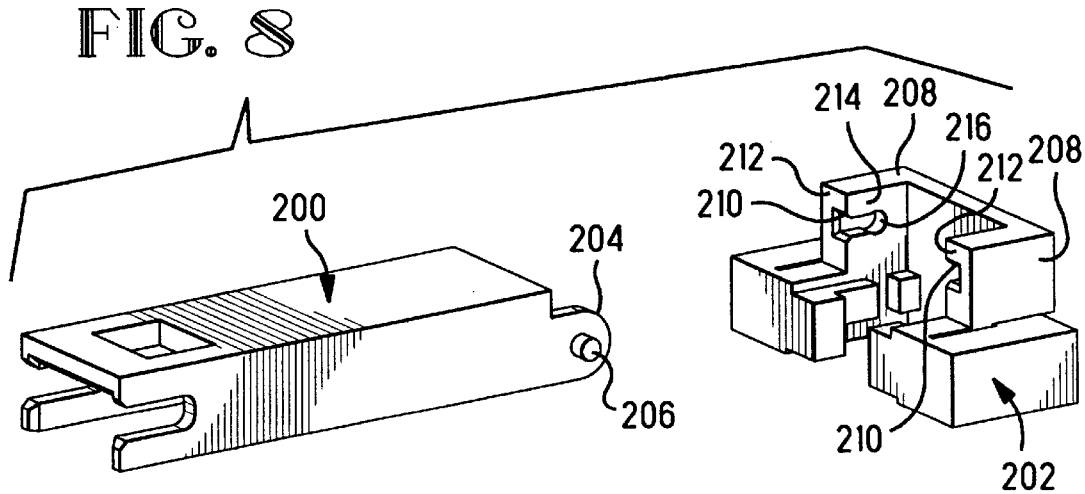
FIG. 8 illustrates another embodiment of a guide member of the present invention exploded from an end block.

Another embodiment of guide assembly of the present invention is shown in FIG. 8, wherein a guide member 200 is utilized in cooperation with an end block 202. Tab sections 204 of guide member 200 include pivot pins or embossments 206 extending laterally outwardly. Upstanding flanges 208 of end block 202 have defined therein slots 210 extending horizontally from an end face 212 and in communication with an inner surface 214, extending to a pivot or bearing surface 216 that will cooperate with a respective pivot pin 206 after assembly. Again, preferably the bearing surface 216 is only slightly larger than the diameter of pivot pin 206 to permit relative rotation, while the width of the slot is slightly less than the diameter of the pivot pin.

Variations and modifications of the specific embodiment described herein, are possible that are within the spirit of the invention and the scope of the claims. For example, the guide members may define guide channels of differing cross-sections or dimensions to correspond with differing module side portions, for polarization.

What is claimed is:

1. A guide assembly of the type mountable onto a surface for guiding a module into position, comprising:

a pair of end blocks, and a pair of guide members defining opposed guide channels and being pivotably secured to respective ones of said end blocks, so that said guide members are pivotable between upright orientations for guided receipt of said module therebetween during movement of said module toward said surface, and recumbent orientations wherein each said guide member is pivoted in a direction toward said opposed guide channels when said module is not present, each said guide member including tab sections adjacent respective upstanding flanges of said end block and that include first cooperating pivot sections, and said upstanding flanges of each said end block adjacent a respective said tab section, include second cooperating pivot sections associated with said first cooperating pivot sections, said first and second cooperating pivot sections cooperating to permit pivoting of a said guide member with respect to a said end block when said guide members have been assembled to respective said end blocks; and one of said first and associated second cooperating pivot sections being a cylindrical embossment, and the other thereof being an aperture within which said cylindrical embossment seats upon assembly, and a slot extends from each said aperture to an entrance permitting a said cylindrical embossment to be received into said slot and moved therealong to become seated in said aperture in a manner permitting pivoting, whereby said guide member is mounted to said end block by said embossments received along respective said slots until seating in respective said apertures.

2. The guide assembly as set forth in claim 1 wherein said end blocks are discrete members.

3. The guide assembly as set forth in claim 1 wherein cooperating stop surfaces are defined on said frame-proximate ends of said guide members and said opposed ends of said frame, to stop pivoting of said guide members when pivoted to said upright orientation.

4. The guide assembly as set forth in claim 1 wherein each said end block includes a connector-receiving aperture disposed between said opposed ends and aligned with said guide channels of said guide members, whereby said module is guided to a mated condition with a connector disposed in said connector-receiving aperture.

5. The guide assembly as set forth in claim 1 wherein each said slot is narrower than a diameter of a respective said embossment.

6. The guide assembly as set forth in claim 5 wherein an entrance to a said slot is widened to facilitate receipt of a respective said embossment thereinto during assembly.

7. The guide assembly as set forth in claim 1 wherein each said slot is oriented orthogonal to a direction of insertion of a said module into said receptacle connector.

8. The guide assembly as set forth in claim 1 wherein each said second cooperating pivot section is an aperture extending into said tab section, each said first cooperating pivot section is a said embossment extending from a said flange of said end block toward a said tab section, and a said slot extends from said aperture to an edge of said tab section.

9. The guide assembly as set forth in claim 8 wherein said tab sections of a said guide member extend along inner surfaces of respective said upstanding flanges of said end block, said slots are defined along outwardly facing surfaces of said tab sections, and said embossments extend inwardly from a said flange of said end block.

10. The guide assembly as set forth in claim 8 wherein said embossments are defined on upstanding flanges of said end blocks.

11. The guide assembly as set forth in claim 8 wherein said embossments are integrally molded to said end blocks.

12. The guide assembly as set forth in claim 8 wherein said slots extend orthogonally with respect to said guide channel.

13. The guide assembly as set forth in claim 12 wherein each said slot extends only partially through a respective said tab section.

14. The guide assembly as set forth in claim 1 wherein each said first cooperating pivot section is a said aperture extending into an upstanding flange of said end block, each said second cooperating pivot section is a said embossment extending from a said tab section toward said upstanding flange, and a said slot extends from said aperture to an end face of said side wall.

15. The guide assembly as set forth in claim 14 wherein said tab sections of a said guide member extend along inner surfaces of respective said flanges of said end block, said slot is defined along an inwardly facing surface of said flange, and said embossment extends outwardly from a said tab section of said guide member.

16. The guide assembly as set forth in claim 14 wherein each said slot extends only partially through a respective said upstanding flange.

* * * * *